United States Patent
Gunasekaran et al.

(10) Patent No.: US 11,777,513 B2
(45) Date of Patent: Oct. 3, 2023

(54) $F_{DAC}/2$ SPUR ESTIMATION AND CORRECTION

(71) Applicant: Texas Instruments Incorporated, Dallas, TX (US)

(72) Inventors: Karthikeyan Gunasekaran, Chennai (IN); Snehasish Roychowdhury, Dakshin Barasat (IN); Rakesh Manjunath, Bengaluru (IN); Aswath V S, Kannur (IN); Sthanunathan Ramakrishnan, Bengaluru (IN); Sarma Sudareswara Gunturi, Bengaluru (IN); Rahul Sharma, Bengaluru (IN); Jagannathan Venkataraman, Bengaluru (IN); Nagarajan Viswanathan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/538,746

(22) Filed: Nov. 30, 2021

(65) Prior Publication Data
US 2022/0239304 A1    Jul. 28, 2022

(30) Foreign Application Priority Data
Jan. 27, 2021   (IN) .............................. 202141003801

(51) Int. Cl.
*H03M 1/10* (2006.01)
*H03M 1/66* (2006.01)
*H03M 1/06* (2006.01)
*H03M 1/08* (2006.01)

(52) U.S. Cl.
CPC ....... *H03M 1/1033* (2013.01); *H03M 1/0631* (2013.01); *H03M 1/0863* (2013.01); *H03M 1/662* (2013.01)

(58) Field of Classification Search
CPC .. H03M 1/1033; H03M 1/662; H03M 1/0631; H03M 1/0863
USPC ................................................. 341/121, 144
See application file for complete search history.

(56) References Cited

U.S. PATENT DOCUMENTS 9,413,394 B1 *  8/2016  Lye .................... H04B 1/0014
10,727,854 B1 *  7/2020  Greshishchev ..... H03M 1/0836

\* cited by examiner

*Primary Examiner* — Khai M Nguyen
(74) *Attorney, Agent, or Firm* — John R. Pessetto; Frank D. Cimino (57) ABSTRACT

A spur correction system for a transmit chain having an interleaving multiplexer. In some embodiments, the spur correction system includes a spur sense chain, a correction controller, and a Q path corrector. The interleaving multiplexer combines signals from multiple bands in response to a clock signal. The spur sense chain estimates an error that is in phase with the clock signal (an I-phase error) and an error that is a derivative of the clock signal (a Q-phase error). The correction controller compensates for the estimated I-phase error by injecting an I-phase correction signal into the transmit chain. The Q path corrector compensates for the estimated Q-phase error by selectively connecting one or more capacitors within the interleaving multiplexer.

20 Claims, 6 Drawing Sheets

FIG. 8

$F_{DAC}/2$ SPUR ESTIMATION AND CORRECTION

CROSS-REFERENCE TO RELATED APPLICATIONS

This application claims priority to India Provisional Application No. 202141003801, filed Jan. 27, 2021, which is hereby incorporated by reference.

BACKGROUND

In 4.5G and 5G wireless markets, wireless transceivers include multi-band transmitters that support multiple transmission frequencies. In some embodiments, each band of a multi-band transmit chain includes a digital-to-analog converter (DAC) that converts the digital signal to analog so that it may be transmitted via an antenna.

In order to reduce power consumption and the number of switching errors that lead to degradation in the spurious-free dynamic range (SFDR), dual band transmit chains are often configured in an interleaving-by-two mode. In an interleaving-by-two configuration, an interleaving multiplexer combines two analog signals output by the two DACs of each of the two bands of a dual band transmit chain.

One drawback of the interleaving-by-two configuration, however, is that errors may be introduced into the signal output by the dual band transmit chain, for example caused by a difference between the magnitudes of the signals in each band and/or a difference in the parasitic capacitance of two transistors used to selectively output the two signals in each band. Because that error signal may be generated at half the frequency of the DACs, it is referred to herein as an $F_{DAC}/2$ spur.

SUMMARY

Disclosed is a spur correction system, for a transmit chain having an interleaving multiplexer, that estimates and corrects for $F_{DAC}/2$ spur. In some embodiments, the spur correction system includes a spur sense chain, a correction controller, and a Q path corrector. The interleaving multiplexer combines signals from multiple bands in response to a clock signal. The spur sense chain estimates an error that is in phase with the clock signal (an I-phase error) and an error that is a derivative of the clock signal (a Q-phase error). The correction controller compensates for the estimated I-phase error by injecting an I-phase correction signal into the transmit chain. The Q path corrector compensates for the estimated Q-phase error by selectively connecting one or more capacitors within the interleaving multiplexer.

In some embodiments, for each band, the Q path corrector includes an array of capacitors, each in series with a switch, coupled between the clock signal and the output path. In those embodiments, the Q path corrector compensates for the estimated Q-phase error by closing one or more of the switches to selectively connect the one or more capacitors within the interleaving multiplexer.

In some embodiments, the spur sense chain includes a multiplexer that selectively outputs an I-phase clock signal or a Q-phase clock signal, a mixer that down-converts the signal output by the interleaving multiplexer by mixing it with the I-phase or Q-phase clock, a low-pass filter that attenuates the intended signal and isolates the $F_{DAC}/2$ spur by filtering the down-converted signal, and an analog-to-digital converter that converts the $F_{DAC}/2$ spur to digital by converting the low-pass filtered and down-converted signal to digital.

In some embodiments, transmit chain includes a digital step attenuator (DSA) with multiple attenuation settings that attenuates the I- and Q-phase errors and the I- and Q-phase correction signals. Therefore, in some embodiments, the correction controller identifies an I-phase correction signal and a Q-phase correction signal for each of the DSA attenuation settings (e.g., during calibration), monitors the attenuation setting of the DSA (e.g., during mission mode operation), and outputs the I-phase correction signal and the Q-phase correction signal for the current DSA attenuation setting.

BRIEF DESCRIPTION OF THE DRAWINGS

For a detailed description of various examples, reference will now be made to the accompanying drawings in which.

The same reference numbers and other reference designators are used in the drawings to depict the same or similar (functionally and/or structurally) features.

DETAILED DESCRIPTION

Figure 1A:
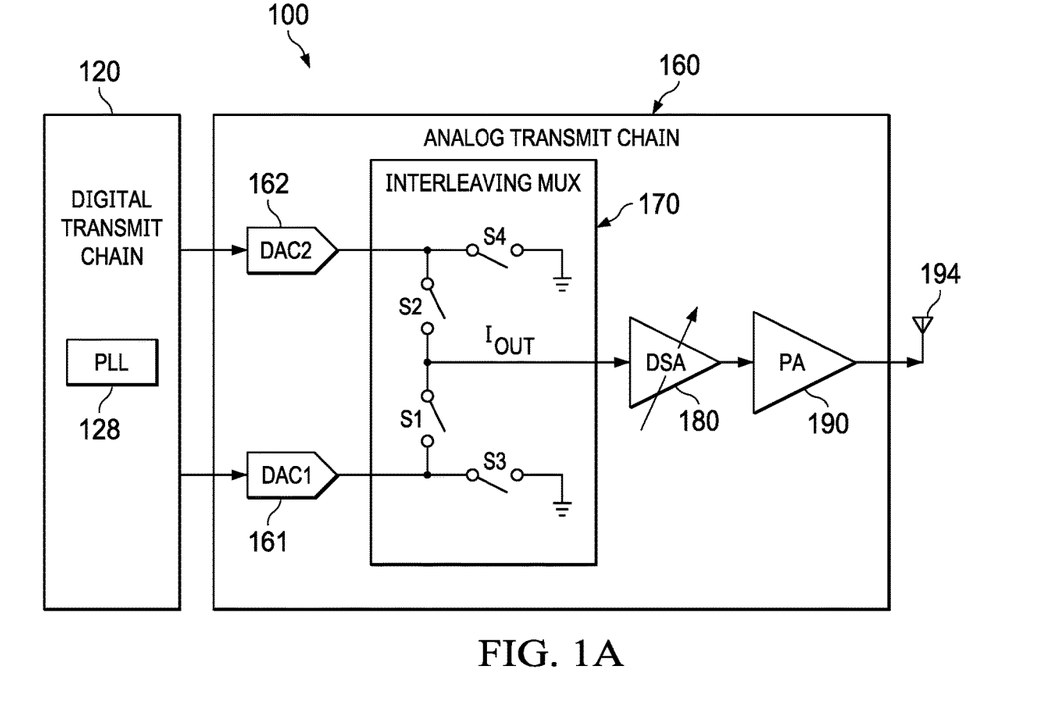
FIG. 1A is a block diagram illustrating a transmit chain in an interleaving-by-2 configuration.

FIG. 1A is a block diagram illustrating a transmit chain 100 in an interleaving-by-2 configuration. In the embodiment of FIG. 1A, the transmit chain 100 includes a digital transmit chain 120 and an analog transmit chain 160. In the dual band embodiment of FIG. 1A, the digital transmit chain 120 outputs two digital signals in two bands to the analog transmit chain 160. The digital transmit chain 120 also includes a phased-lock loop (PLL) 128 that generates clock signals for mixers in the transmit chain 100.

In the dual band embodiment of FIG. 1A, the analog transmit chain 160 includes a first digital-to-analog converter (DAC) 161 for the first band and a second DAC 162 for the second band. The first DAC 161 converts the digital signal in the first band output by the digital transmit chain 120 to analog and the second DAC 162 converts the digital signal in the second band output by the digital transmit chain 120 to analog.

In the interleaving-by-2 embodiment of FIG. 1A, the analog transmit chain 160 includes an interleaving multiplexer (MUX) 170. The outputs of the first DAC 161 and the second DAC 162 are each coupled to one of two inputs of the interleaving multiplexer 170. The interleaving multiplexer 170 outputs an analog output signal $I_{OUT}$ that includes the analog signals output by both the first DAC 161 and the second DAC 162.

In the embodiment of FIG. 1A, the first DAC 161 is coupled to the output $I_{OUT}$ of the interleaving multiplexer 170 via a first switch S1 and the second DAC 162 is coupled to the output $I_{OUT}$ via a second switch S2. The switches S1 and S2 are complementary, meaning the switch S1 is closed whenever the switch S2 is opened and the switch S1 is opened whenever the switch S2 is closed. The first DAC 161 is also coupled to ground via a third switch S3. The second DAC 162 is coupled to ground via a fourth switch S4.

The switches S3 and S4 are also complementary. The third switch S3 connects the first DAC 161 to ground when the second switch S2 connects the second DAC 162 to the output $I_{OUT}$ and the fourth switch S4 connects the second DAC 162 to ground when the first switch S1 connects the first DAC 161 to the output $I_{OUT}$.

The output $I_{OUT}$ of the interleaving multiplexer 170 is coupled to the input of a digital step attenuator (DSA) 180. The DSA 180 is a variable gain amplifier that amplifies and/or attenuates the signal output by the interleaving multiplexer 170. The output of the DSA 180 is coupled to the input of a power amplifier 190. The power amplifier 190 amplifies the analog signal output by the transmit chain 100 for transmission via an antenna 194. The gain of the power amplifier 190 can vary, for example with the temperature of the transmit chain 100. To compensate for variation in the gain of the power amplifier 190, the DSA 180 has multiple attenuation/amplification settings. For example, the DSA 180 may have 31 attenuation/amplification settings in 1-dB increments from 0 to 30 dB. In response to a change in the gain of the power amplifier 190, the selected attenuation setting of the DSA 180 may be adjusted to compensate for the change in gain of the power amplifier 190.

Figure 1B:
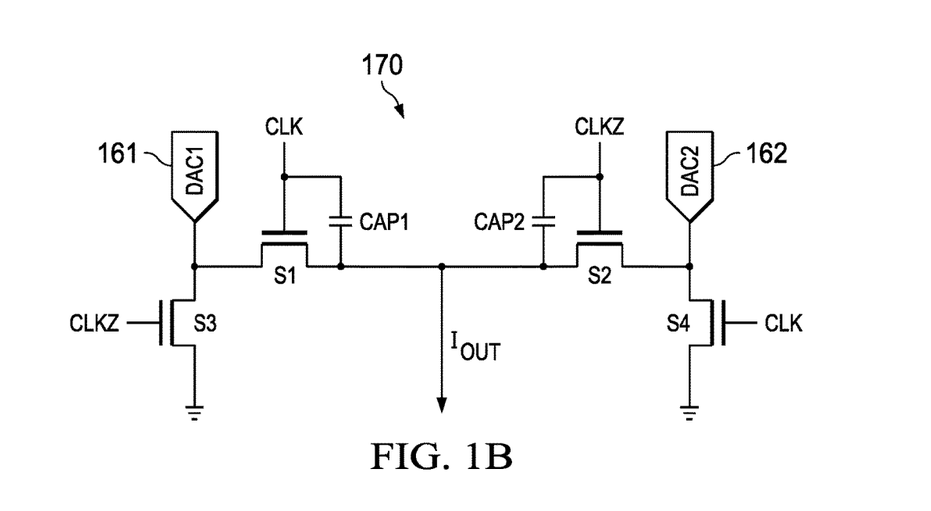
FIG. 1B is a diagram illustrating the interleaving multiplexer of FIG. 1A in greater detail.
Figure 1C:
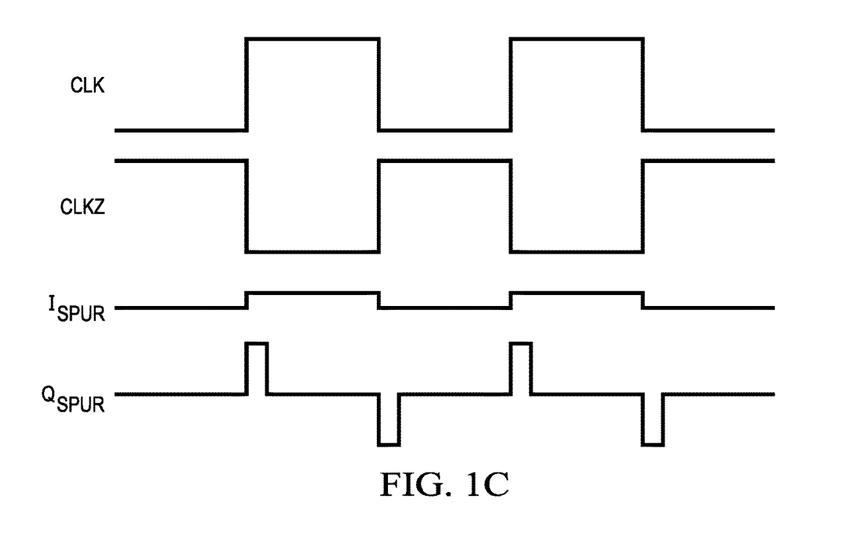
FIG. 1C is an example timing diagram of the interleaving multiplexer of FIGS. 1A and 1B.

FIG. 1B is a diagram illustrating the interleaving multiplexer 170 in greater detail. FIG. 1C is an example timing diagram of the interleaving multiplexer 170.

In the embodiment of FIG. 1B, each of the switches S1, S2, S3 and S4 are complementary metal-oxide-semiconductor (CMOS) transistors. The gates of the transistors S1 and S4 are controlled by a clock signal CLK, and the gates of the transistors S2 and S3 are controlled by a clock signal CLKZ. In the embodiment of FIG. 1B, the clock signals CLK and CLKZ are complementary (as shown in the timing diagram of FIG. 1C), meaning the clock signal CLK rises from low to high each time the clock signal CLKZ falls from high to low and the clock signal CLKZ rises from low to high each time the clock signal CLK falls from high to low. The first transistor S1 has a parasitic capacitance CAP1 between the gate and the drain of the first transistor S1. The second transistor S2 has a parasitic capacitance CAP2 between the gate and the drain of the second transistor S2.

In response to the clock signal CLK enabling S1 (e.g., by providing a logic "1" value if S1 is an n-channel device, such as an nMOSFET, or by providing a logic "0" value if S1 is a p-channel device, such as a pMOSFET), the output of the first DAC 161 is output by the interleaving multiplexer 170 via the first transistor S1 and the second DAC 162 is coupled to ground via the fourth transistor S4 (e.g., by providing a logic "1" value if S4 is an n-channel device, such as an nMOSFET, or by providing a logic "0" value if S4 is a p-channel device, such as a pMOSFET). In response to the clock signal CLKZ enabling S2 (e.g., by providing a logic "1" value if S2 is an n-channel device, such as an nMOSFET, or by providing a logic "0" value if S2 is a p-channel device, such as a pMOSFET), the output of the second DAC 162 is output by the interleaving multiplexer 170 via the second transistor S2 and the first DAC 161 is coupled to ground via the third transistor S3 (e.g., by providing a logic "1" value if S3 is an n-channel device, such as an nMOSFET, or by providing a logic "0" value if S3 is a p-channel device, such as a pMOSFET).

Ideally, the magnitude of the output of the first DAC 161 is equal to the magnitude of the output of the second DAC 162. In those ideal circumstances, the magnitude of the output signal $I_{OUT}$ is constant. However, as shown in the timing diagram of FIG. 1C, there may be an unintentional difference between the magnitude of the output of the first DAC 161 and the magnitude of the output of the second DAC 162. In the example timing diagram shown in FIG. 1C, for instance, the magnitude of the output of the first DAC 161 is higher than the magnitude of the output of the second DAC 162, causing an error that is in phase with the clock signal CLK. Alternatively, if the output of the second DAC 162 has a higher magnitude than the output of the first DAC 161, the error will be contemporaneous with the clock signal CLKZ. Because the error caused by a difference in the magnitudes of the signals output by the DACs 161 and 162 is in phase with one of the clock signals CLK or CLKZ, that error is referred to herein as an I-phase error $I_{SPUR}$.

Each time the clock signal CLK rises from low to high, a charge pushes through the parasitic capacitance CAP1 of the first transistor S1 from the clock signal CLK to the output $I_{OUT}$. At the same time, the clock signal CLKZ falls from high to low and the parasitic capacitance CAP2 of the second transistor S2 takes a charge away from the output $I_{OUT}$. Similarly, each time the clock signal CLKZ rises from low to high and the clock signal CLK falls from high to low, a charge pushes through the parasitic capacitance CAP2 of the first transistor S2 from the clock signal CLKZ to the output $I_{OUT}$ and the parasitic capacitance CAP1 of the second transistor S1 takes a charge away from the output $I_{OUT}$.

Ideally, the parasitic capacitance CAP1 of the first transistor S1 is equal to the parasitic capacitance CAP2 of the second transistor S2. In those ideal circumstances, during each transition, the parasitic capacitance CAP2 of the second transistor S2 adds or takes away a charge of the same magnitude as the parasitic capacitance CAP1 of the first transistor S1 and those signals cancel out. However, there may be an unintentional difference between the parasitic capacitance CAP1 of the first transistor S1 and the parasitic capacitance CAP2 of the second transistor S2, which also causes an error. In the example timing diagram shown in FIG. 1C, for instance, the clock signal CLK transitioning from low to high causes a positive error and the clock signal CLK transitioning from high to low causes a negative error. Because the error caused by a difference in the parasitic capacitance CAP1 and CAP2 of the transistors S1 and S2 is a derivative of the clock signal CLK or CLKZ, that error is referred to herein as a Q-phase error $Q_{SPUR}$. The capacitance mismatch also contributes to the I-phase error $I_{SPUR}$.

As shown in FIG. 1C, the interleaving multiplexer 170 may cause both an I-phase error $I_{SPUR}$ and a Q-phase error $Q_{SPUR}$ at half the frequency of the first and second DACs 161 and 162. Therefore, together, the I-phase error $I_{SPUR}$ and the Q-phase error $Q_{SPUR}$ are referred to herein as an $F_{DAC}/2$ spur.

Figure 2:
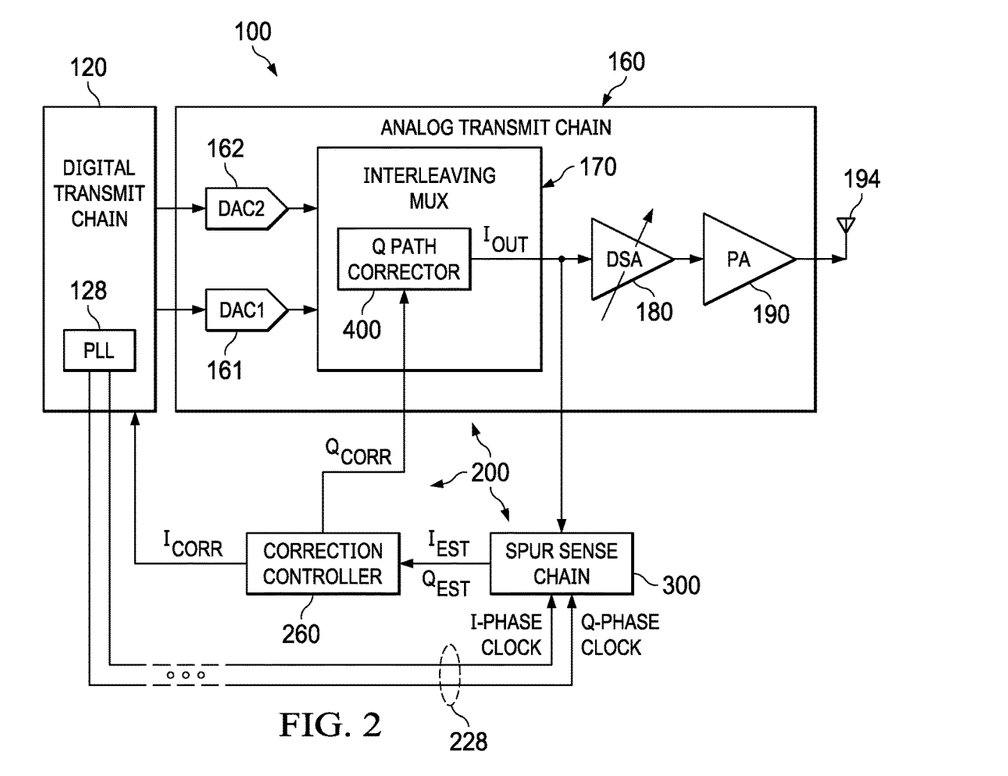
FIG. 2 is a block diagram of an $F_{DAC}/2$ spur estimation and correction system, including a spur sense chain and a Q path corrector, according to an illustrative embodiment.

FIG. 2 is a block diagram of a transmit chain 100 that incorporates an $F_{DAC}/2$ spur estimation and correction system 200 according to an illustrative embodiment. As described above with reference to FIG. 1A, the attenuation setting of the DSA 180 is selected to compensate for variations in the gain of the power amplifier 190. The $F_{DAC}/2$ spur estimation and correction system 200 includes a spur sense chain 300, a correction controller 260, and a Q path corrector 400.

The spur sense chain 300, which is described in detail below with reference to FIG. 3, calculates an estimate $I_{EST}$ of the I-phase error $I_{SPUR}$ and an estimate $Q_{EST}$ of the Q-phase error $Q_{SPUR}$. In the embodiment of FIG. 2, the spur sense chain 300 is coupled to the output of the interleaving multiplexer 170 and receives I- and Q-phase clock signals generated by the PLL 128 via signal paths 228.

The Q path corrector 400, which is described in detail below with reference to FIG. 4, enables the correction controller 260 to compensate for the Q-phase error $Q_{SPUR}$ by reducing the capacitance mismatch of the interleaving multiplexer 170.

The correction controller 260 may be any hardware processing unit (such as a processor, state machine, logic circuitry and/or application specific integrated circuit) and/or software that performs the functions described herein. The correction controller 260 is coupled to the spur sense chain 300, the digital transmit chain 120, and the Q path corrector 400. The correction controller 260 receives the I- and Q-phase error estimates $I_{EST}$ and $Q_{EST}$ from the spur sense chain 300. As described in detail below with reference to FIGS. 6-7, the correction controller 260 generates an I-phase correction signal $I_{CORR}$ that, when added to the output of the transmit chain 100, compensates for the I-phase error $I_{SPUR}$ by canceling out the I-phase error $I_{SPUR}$ and generates a Q-phase correction signal $Q_{CORR}$ that, when added to the output of the transmit chain 100, compensates for the Q-phase error $Q_{SPUR}$ by canceling out the Q-phase error $Q_{SPUR}$.

As described above, the I-phase error $I_{SPUR}$ may be caused by an unintentional difference between the magnitude of the output of the first DAC 161 and the magnitude of the output of the second DAC 162. Therefore, the I-phase error $I_{SPUR}$ may be corrected by adding a DC offset, having the appropriate magnitude, to the digital signal provided to either the first DAC 161 or the second DAC 162. Accordingly, in the embodiment of FIG. 2, the correction controller 260 outputs the I-phase correction signal $I_{CORR}$ to the digital transmit chain 120, which adds the I-phase correction signal $I_{CORR}$ (e.g., via an adder) to one of the digital signals output by the digital transmit chain 120. Because the correction controller 260 can generate and output an I-phase correction signal $I_{CORR}$ having either a positive or negative magnitude, the digital transmit chain 120 may be configured to add the I-phase correction signal $I_{CORR}$ to the digital signal output to either the first DAC 161 or the second DAC 162. In either embodiment, the correction controller 260 generates an I-phase correction signal $I_{CORR}$ that provides the appropriate (positive or negative) DC offset to reduce the magnitude difference between the outputs of the DACs 161 and 162 and reduce the I-phase error $I_{SPUR}$.

Unlike the I-phase error $I_{SPUR}$, the Q-phase error $Q_{SPUR}$ that is out of phase with the clock signals CLK and CLKZ is not readily corrected entirely in the digital domain. Accordingly, in the embodiment of FIG. 2, the $F_{DAC}/2$ spur estimation and correction system 200 includes the Q path corrector 400, which enables the correction controller 260 to compensate for the Q-phase error $Q_{SPUR}$ by adding the Q-phase correction signal $Q_{CORR}$ to the output of the transmit chain 100 in the analog domain. As described in detail below with reference to FIG. 4, the Q path corrector 400 enables the correction controller 260 to add the Q-phase correction signal $Q_{CORR}$ to the output of the transmit chain 100 by reducing the capacitance mismatch of the interleaving multiplexer 170.

Figure 3:
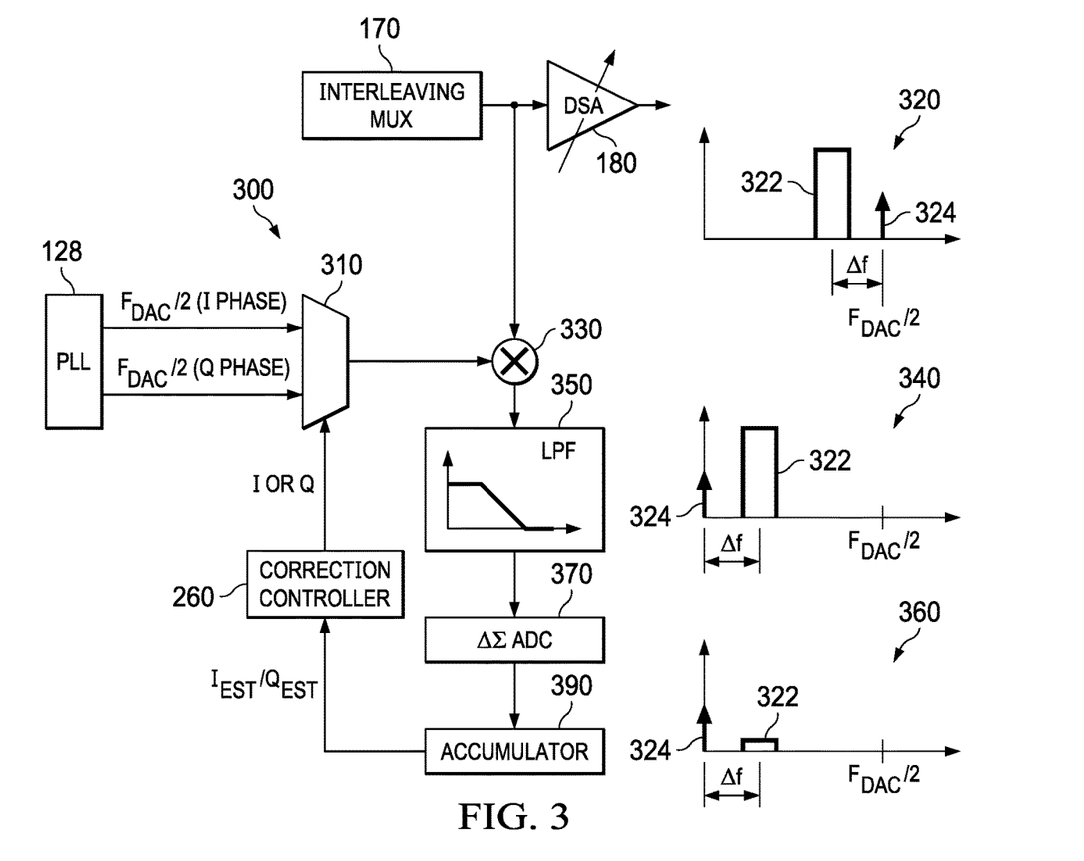
FIG. 3 is a block diagram of the spur sense chain according to an illustrative embodiment and corresponding amplitude versus frequency diagrams.

FIG. 3 is a block diagram of the spur sense chain 300 according to an illustrative embodiment. In the embodiment of FIG. 3, the spur sense chain 300 includes a multiplexer 310, a mixer 330, a low-pass filter 350, an analog-to-digital converter (ADC) 370, and a digital accumulator 390. Graph 320 is a graph of example signals output by the interleaving multiplexer 170. Graph 340 is a graph of example signals output by the mixer 330. Graph 360 is a graph of example signals output by the low-pass filter 350. In each of the graphs 320, 340, and 360, the horizontal axis represents frequency and the vertical axis represents amplitude.

As shown in the graph 320, the output of the interleaving multiplexer 170 includes both the intended radio frequency (RF) signal 322 within the transmit band of the transmit chain 100 and the unintended spur 324 at the frequency $F_{DAC}/2$, which is half the frequency of the first and second DACs 161 and 162 of the transmit chain 100. The frequency difference between the center frequency of the transmit band and the frequency $F_{DAC}/2$ of the spur 324 is identified as Δf. As described above, the spur 324 includes both the I-phase error $I_{SPUR}$ and the Q-phase error $Q_{SPUR}$. As described in detail below, the spur sense chain 300 calculates the estimates $I_{EST}$ and $Q_{EST}$ of both the I- and Q-phase errors $I_{SPUR}$ and $Q_{SPUR}$.

The multiplexer 310 includes a first input that receives an I-phase clock signal having a frequency of $F_{DAC}/2$ and a second input that receives a Q-phase clock signal having a frequency of $F_{DAC}/2$. In the embodiment of FIG. 3, the multiplexer 310 receives the I-phase clock signal and the Q-phase clock signal from the PLL 128 used the transmit chain 100 to generate the intended RF signal 322. The multiplexer 310 selects and outputs either the I-phase clock or the Q-phase clock in response to a control signal received from the correction controller 260. For example, the correction controller may output a control signal of "0" (a logic "low"), causing the multiplexer 310 to select and output the signal received via the first input (in this example, the I-phase clock) and output a control signal of "1" (a logic "high"), causing the multiplexer 310 to select and output the signal received via the second input (in this example, the Q-phase clock). By allowing the correction controller 260 to select either the I-phase clock or the Q-phase clock, the multiplexer 310 enables the correction controller 260 to use the spur sense chain 300 to measure either the estimated I-phase error $I_{EST}$ or the estimated Q-phase error $Q_{EST}$ as described below.

One input of the mixer 330 is coupled to the output of the interleaving multiplexer 170 and the other input of the mixer 330 is coupled to the output of the multiplexer 310. The mixer 330 mixes the output of the interleaving multiplexer 170 with the clock signal selected by the correction controller 260 (e.g. the output by the multiplexer 310). As shown in the graph 340, the mixer 330 down-converts the frequency of the spur 324 to 0 Hz (DC) and the frequency of the RF signal 322 to Δf. The mixer 330 also attenuates the down-converted spur 324 and the down-converted RF signal 322 by approximately π/4.

The output of the mixer 330 is coupled to the input of the low-pass filter 350. To isolate the spur 324 from the RF signal 322, the low-pass filter 350 filters the down-converted RF signal 322 and the down-converted spur 324. The cutoff frequency of the low-pass filter 350 is lower than the frequency Δf. Therefore, as shown in the graph 360, the low-pass filter 350 greatly attenuates the down-converted RF signal 322 relative to the amount of attenuation of the down-converted spur 324.

The output of the low-pass filter 350 is coupled to the input of the ADC 370. The output of the ADC 370 is coupled to the input of the digital accumulator 390. Together, the ADC 370 and the digital accumulator 390 measure the amplitude of the DC signal (the spur 324) output by the low-pass filter 350. The ADC 370 converts the analog down-converted and filtered spur 324 to digital. In some embodiments, the ADC 370 may be a delta sigma ADC, for example a single bit first order delta sigma ADC. The digital accumulator 390 sums and stores the digital output of the ADC 370. The digital accumulator 390 may be implemented, for example, using adders and digital storage elements (e.g., flip-flops). The digital accumulator 390 is coupled to the correction controller 260, enabling the correction controller 260 to read the data stored by the correction controller 260.

When the I-phase clock is selected using the multiplexer 310, the spur sense chain 300 generates an estimate $I_{EST}$ of the I-phase error $I_{SPUR}$, which is stored by the digital accumulator 390. When the Q-phase clock is selected using the multiplexer 310, the spur sense chain 300 generates an estimate $Q_{EST}$ of the Q-phase error $Q_{SPUR}$, which is stored by the digital accumulator 390. Accordingly, the spur sense chain 300 enables the correction controller 260 to output a control signal to the multiplexer 310 to select either the I-phase clock or the Q-phase clock and receive either the I-phase error estimate $I_{EST}$ or the Q-phase error estimate $Q_{EST}$.

Figure 4:
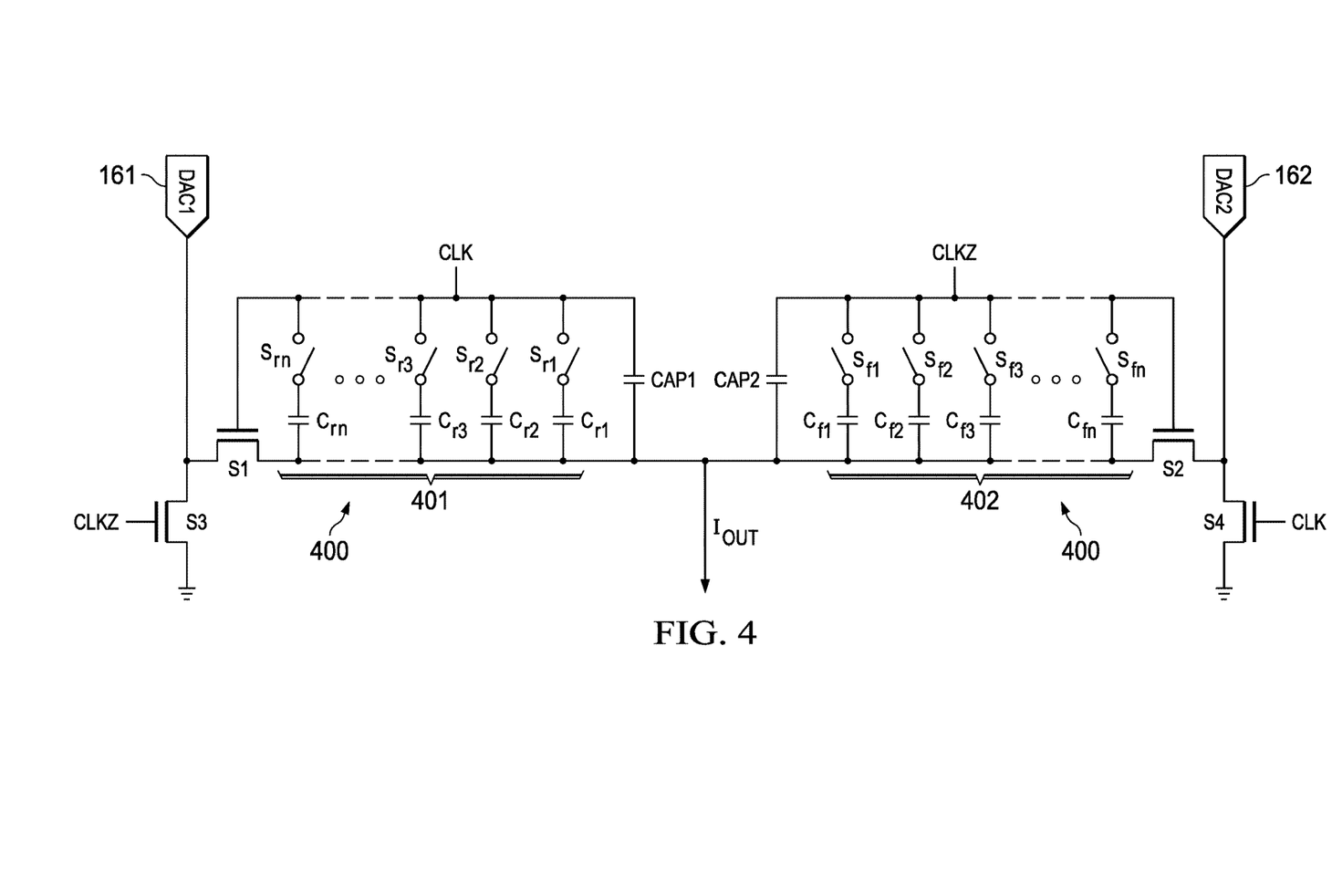
FIG. 4 is a schematic diagram of the Q path corrector according to an illustrative embodiment.

FIG. 4 is a diagram of the Q path corrector 400 according to an illustrative embodiment. In the embodiment of FIG. 4, the Q path corrector 400 includes two binary capacitor arrays 401 and 402 that are integrated into the interleaving multiplexer 170. The first binary capacitor array 401 includes n capacitors $C_{r1}$, $C_{r2}$, $C_{r3}$, . . . $C_{rn}$ (collectively or individually referred to as capacitor(s) $C_r$), each coupled in series to a switch $s_{r1}$, $s_{r2}$, $s_{r3}$, . . . $s_{rn}$ (collectively or individually referred to as switch(es) $s_r$). The second binary capacitor array 402 includes n capacitors $C_{f1}$, $C_{f2}$, $C_{f3}$, . . . $C_{fn}$ (collectively or individually referred to as capacitor(s) $C_f$), each coupled in series to a switch $s_{f1}$, $s_{f2}$, $s_{f3}$, . . . $s_{fn}$ (collectively or individually referred to as switch(es) $s_f$). Each capacitor $C_r$ and switch $s_r$ pair of the first binary capacitor array 401 is coupled between the clock signal CLK and the output $I_{OUT}$. Each capacitor $C_f$ and switch $s_f$ pair of the second binary capacitor array 402 is coupled between the clock signal CLKZ and the output $I_{OUT}$. Each binary capacitor array 401 and 402 may include any number of n capacitors $C_r$ and $C_f$ (e.g., seven capacitors $C_{r1}$-$C_{r7}$ and $C_{f1}$-$C_{f7}$). In the embodiment of FIG. 4, each capacitor array 401 and 402 includes the same number of capacitors $C_r$ or $C_f$.

In some embodiments, the first capacitor $C_{r1}$ of the first binary capacitor array 401 has the same capacitance as the first capacitor $C_{f1}$ of the second binary capacitor array 402, the second capacitor $C_{r2}$ of the first binary capacitor array 401 has the same capacitance as the second capacitor $C_{f2}$ of the second binary capacitor array 402, the third capacitor $C_{r3}$ of the first binary capacitor array 401 has the same capacitance as the second capacitor $C_{f3}$ of the second binary capacitor array 402, etc. In some embodiments, the second capacitor $C_{r2}$ and $C_{f2}$ of each binary capacitor array 401 and 402 has twice the capacitance of the first capacitor $C_{r1}$ or $C_{f1}$, the third capacitor $C_{r3}$ and $C_{f3}$ has have twice the capacitance of the second capacitor $C_{r2}$ or $C_{f2}$, etc. Multiple switches $s_r$ or $s_r$ may be closed to add the capacitance of the capacitors $C_r$ or $C_r$ coupled to those closed switches $s_r$ or $s_r$. In those embodiments, like the digits of a binary number, the n capacitors $C_r$ and $C_r$ in each binary capacitor array 401 and 402 may be used to add any of the $2^n$ potential capacitances.

As described above, the Q-phase error $Q_{SPUR}$ is caused by a mismatch between the capacitance CAP1 (situated between the clock signal CLK and the output $I_{OUT}$) and the capacitance CAP2 (situated between the clock signal CLKZ and the output $I_{OUT}$). To correct the Q-phase error $Q_{SPUR}$, one or more of the switches $s_r$ or $s_r$ are closed to couple one or more of the capacitors $C_r$ or $C_r$ between the output $I_{OUT}$ and the clock signal CLK or CLKZ. By increasing the capacitance between the output $I_{OUT}$ and either the clock signal CLK or the clock signal CLKZ, the Q path corrector 400 compensates for any difference in the parasitic capacitances CAP1 and CAP2 and compensates for the Q-phase error $Q_{SPUR}$.

As briefly mentioned above with reference to FIG. 2, the correction controller 260 receives the Q-phase error estimate $Q_{EST}$ from the spur sense chain 300 and outputs a Q-phase correction signal $Q_{CORR}$ to the Q path corrector 400 to compensate for the Q-phase error $Q_{SPUR}$. In the embodiment of FIG. 4, the Q path corrector 400 enables the correction controller 260 to add the Q-phase correction signal $Q_{CORR}$ to the output of the transmit chain 100 by increasing the capacitance between the output $I_{OUT}$ and either the clock signal CLK or the clock signal CLKZ, thereby compensating for the difference between the parasitic capacitance CAP1 of the first transistor S1 and the parasitic capacitance CAP2 of the second transistor S2.

The Q-phase error $Q_{SPUR}$ has a phase of either 90° or 270° and a magnitude. Depending on whether the phase of the Q-phase error estimate $Q_{EST}$ is 90° or 270°, the correction controller 260 employs either the first binary capacitor array 401 or the second binary capacitor array 402. As described in detail below with reference to FIGS. 6-7, the correction controller 260 generates a Q-phase correction signal $Q_{CORR}$ to add to the output of the transmit chain 100 and compensate for the Q-phase error $Q_{SPUR}$. To add the Q-phase correction signal $Q_{CORR}$ to the output of the transmit chain 100, the correction controller 260 outputs control signals to close one or more switches $s_r$ or $s_r$ of the Q path corrector 400 and add the capacitance of the capacitors $C_r$ or $C_r$ coupled to those switches $s_r$ or $s_r$.

Adding capacitance using either capacitor array 401 or capacitor array 402 adds a Q-phase correction signal $Q_{CORR}$ having a magnitude that is dependent on the amount of capacitance added. For instance, in the embodiments described above where each binary capacitor array 401 and 402 can add any of $2^n$ potential capacitances by closing any of n switches $s_r$ or $s_r$ to connect any of n capacitors $C_r$ or $C_r$, each binary capacitor array 401 and 402 enables the correction controller 260 to add a Q-phase correction signal $Q_{CORR}$ having any of $2^n$ potential magnitudes. The magnitudes of each of those $2^n$ Q-phase correction signals $Q_{CORR}$ may be measured, for example, by adding each of the $2^n$ potential capacitances using the Q path corrector 400 and measuring each change in the estimated Q-phase error $Q_{EST}$ using the spur sense chain 300. Accordingly, in some embodiments, the correction controller 260 stores the $2^n$ potential Q-phase correction signals $Q_{CORR}$ (e.g., in a look-up table) and the switches $s_r$ or $s_{r'}$ that, when closed, add each of those $2^n$ Q-phase correction signals $Q_{CORR}$. In those embodiments, to add a Q-phase correction signal $Q_{CORR}$ to the output of the transmit chain 100, the correction controller 260 outputs control signals to close the switches $s_r$ or $s_{r'}$ that, when closed, cause the Q path corrector to add the Q-phase correction signal $Q_{CORR}$.

As described above with reference to FIG. 3, the spur sense chain 300 is used by the correction controller 260 to generate an estimate $I_{EST}$ of the I-phase error $I_{SPUR}$ and the estimate $Q_{EST}$ of the Q-phase error $Q_{SPUR}$. To measure the I-phase error estimate $I_{EST}$ or the Q-phase error estimate $Q_{EST}$, the correction controller 260 uses the multiplexer 310 to select either I-phase clock signal or the Q-phase clock signal. However, there may be a phase difference between the clock signal used to generate the I- and Q-phase errors $Q_{SPUR}$ and $I_{SPUR}$ and the I- and Q-phase clock signals received by the multiplexer 310. In the embodiment of FIG. 2, the I-phase and Q-phase clock signals received by the multiplexer 310 are generated by the same phased-locked loop 128 used by the transmit chain 100 to generate the RF signal that includes the I-phase error $I_{SPUR}$ and Q-phase error $Q_{SPUR}$. However, the buffer length along the transmit chain 100 may be different than the buffer length along the I- Q signal paths 228. Therefore, there may be a phase difference between the I-phase and Q-phase clock signals received by the multiplexer 310 and the I-phase error $I_{SPUR}$ and the Q-phase error $Q_{SPUR}$. Accordingly, there may not be a direct correlation between the I-phase error estimate $I_{EST}$ and the I-phase error $I_{SPUR}$ and between the Q-phase error estimate $Q_{EST}$ and the Q-phase error $Q_{SPUR}$.

Figure 5:
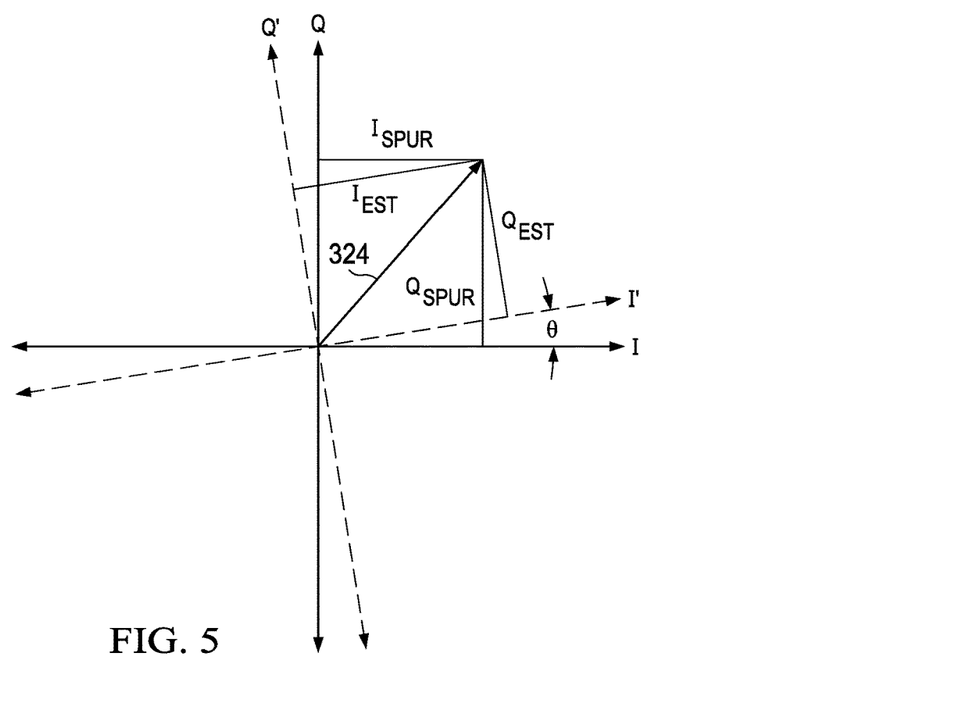
FIG. 5 is a graphical representation of the relationship between the I- and Q-phase error estimates measured by the spur sense chain and I- and Q-phase errors.

FIG. 5 is a graphical representation of the relationship between the I- and Q-phase error estimates $I_{EST}$ and $Q_{EST}$ and the I- and Q-phase errors $I_{SPUR}$ and $Q_{SPUR}$.

As shown in FIG. 5, the unintended spur 324 is a vector in the I-Q coordinate plane having an in-phase component $I_{SPUR}$ and a quadrature component $Q_{SPUR}$. Because of the phase difference θ between the clock signal used by the transmit chain 100 to generate the I- and Q-phase errors $I_{SPUR}$ and $Q_{SPUR}$ and the I- and Q-phase clock signals used by the spur sense chain 300, the I- and Q-phase error estimates $I_{EST}$ and $Q_{EST}$ and will be calculated by the spur sense chain 300 on an I'-Q' coordinate plane that is rotated by an unknown angle θ with respect to the I-Q coordinate plane. Therefore, in some embodiments, the correction controller 260 captures the cross correlation between the I-phase error estimate $I_{EST}$ and the Q-phase error estimate $Q_{EST}$ with respect to the I-phase error $I_{SPUR}$ and the Q-phase error $Q_{SPUR}$ by generating a 2×2 channel matrix.

Figure 6:
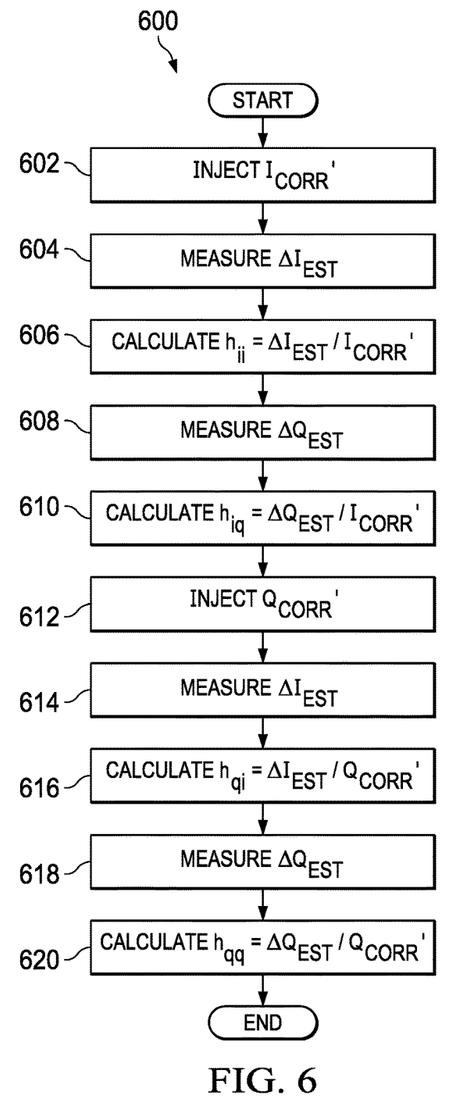
FIG. 6 is a flowchart illustrating a process for determining cross correlation between I- and Q-phase error estimates and I- and Q-phase errors according to an illustrative embodiment.

FIG. 6 is a flowchart of a process 600 for determining the cross correlation between the I- and Q-phase error estimates $I_{EST}$ and $Q_{EST}$ and I- and Q-phase errors $I_{SPUR}$ and $Q_{SPUR}$ according to an illustrative embodiment.

A known I-phase correction signal $I_{CORR}'$ is injected into the signal output by the transmit chain 100 in step 602. In some embodiments, the correction controller 260 injects the known I-phase correction signal $I_{CORR}'$ into the signal output by the transmit chain 100 by outputting the known I-phase correction signal $I_{CORR}'$ to the digital transmit chain 120 as described above with reference to FIG. 2, which adds the known I-phase correction signal $I_{CORR}'$ to the digital signal in one of the bands (e.g., using an adder).

The change in I-phase error $\Delta I_{EST}$ caused by the injection of the known I-phase correction signal $I_{CORR}'$ is calculated in step 604. In some embodiments, the correction controller 260 calculates the change in I-phase error $\Delta I_{EST}$ by calculating the difference between the estimated I-phase error $I_{EST}$, calculated using the spur sense chain 300 as described above with reference to FIG. 3, before and after the known I-phase correction signal $I_{CORR}'$ is injected.

A channel coefficient h is calculated in step 606 by dividing the change in I-phase error $\Delta I_{EST}$ by the known I-phase correction signal $I_{CORR}'$.

The change in Q-phase error $\Delta Q_{EST}$ caused by the injection of the known I-phase correction signal $I_{CORR}'$ is calculated in step 608. In some embodiments, the correction controller 260 calculates the change in Q-phase error $\Delta Q_{EST}$ by calculating the difference between the estimated Q-phase error $Q_{EST}$, calculated using the spur sense chain 300 as described above with reference to FIG. 3, before and after the known I-phase correction signal $I_{CORR}'$ is injected.

A channel coefficient $h_{iq}$ is calculated in step 610 by dividing the change in Q-phase error $\Delta Q_{EST}$ by the known I-phase correction signal $I_{CORR}'$.

A known Q-phase correction signal $Q_{CORR}$, is injected into the signal output by the transmit chain 100 in step 612. In some embodiments, the correction controller 260 injects the known Q-phase correction signal $Q_{CORR}'$ into the signal output by the transmit chain 100 by using the Q path corrector 400 to close one or more of the switches $c_r$ or $c_f$ and add the capacitance of the one or more capacitors $C_r$ or $C_r$ connected in series with the one or more switches $c_r$ or $c_f$ as described above with reference to FIG. 4.

The change in I-phase error $\Delta I_{EST}$ caused by the injection of the known Q-phase correction signal $Q_{CORR}'$ is calculated in step 614. In some embodiments, the correction controller 260 calculates the change in I-phase error $\Delta I_{EST}$ by calculating the difference between the estimated I-phase error $I_{EST}$, calculated using the spur sense chain 300 as described above with reference to FIG. 3, before and after the known Q-phase correction signal $Q_{CORR}'$ is injected.

A channel coefficient $h_{qi}$ is calculated in step 616 by dividing the change in I-phase error $\Delta I_{EST}$ by the known Q-phase correction signal $Q_{CORR}'$.

The change in Q-phase error $\Delta Q_{EST}$ caused by the injection of the known Q-phase correction signal $Q_{CORR}'$ is calculated in step 618. In some embodiments, the correction controller 260 calculates the change in Q-phase error $\Delta Q_{EST}$ by calculating the difference between the estimated Q-phase error $Q_{EST}$, calculated using the spur sense chain 300 as described above with reference to FIG. 3, before and after the known Q-phase correction signal $Q_{CORR}'$ is injected.

A channel coefficient $h_{qq}$ is calculated in step 610 by dividing the change in Q-phase error $\Delta Q_{EST}$ by the known Q-phase correction signal $Q_{CORR}'$.

As described above with reference to FIG. 2, the correction controller 260 corrects for the I- and Q-phase errors $I_{SPUR}$ and $Q_{SPUR}$ by calculating the estimated I- and Q-phase errors $I_{EST}$ and $Q_{EST}$ using the spur sense chain 300 and generating I- and Q-phase correction signals $I_{CORR}$ and $Q_{CORR}$. The 2×2 channel matrix $$\begin{bmatrix} h_{ii} & h_{iq} \\ h_{qi} & h_{qq} \end{bmatrix}$$

generated using the process 600 captures the cross correlation between the I- and Q-phase error estimates $I_{EST}$ and $Q_{EST}$ and the I- and Q-phase errors $I_{SPUR}$ and $Q_{SPUR}$. As shown in equation 1, the relationship between the I- and Q-phase error estimates $I_{EST}$ and $Q_{EST}$ and the I- and Q-phase correction signals $I_{CORR}$ and $Q_{CORR}$ necessary to correct the I- and Q-phase errors $I_{SPUR}$ and $Q_{SPUR}$ is a function of the 2×2 channel matrix $$\begin{bmatrix} h_{ii} & h_{iq} \\ h_{qi} & h_{qq} \end{bmatrix}$$

generated using the process 600:

$$\begin{bmatrix} h_{ii} & h_{iq} \\ h_{qi} & h_{qq} \end{bmatrix} \begin{bmatrix} I_{CORR} \\ Q_{CORR} \end{bmatrix} = -\begin{bmatrix} I_{EST} \\ Q_{EST} \end{bmatrix} \quad (1)$$

Rearranging equation 1 as shown in equation 2, the I- and Q-phase correction signals $I_{CORR}$ and $Q_{CORR}$ necessary to correct estimated I- and Q-phase errors $I_{EST}$ and $Q_{EST}$ can be generated as a function of those estimated I- and Q-phase errors $I_{EST}$ and $Q_{EST}$ and the 2×2 channel matrix $$\begin{bmatrix} h_{ii} & h_{iq} \\ h_{qi} & h_{qq} \end{bmatrix}$$

generated using the process 600:

$$\begin{bmatrix} I_{CORR} \\ Q_{CORR} \end{bmatrix} = -\begin{bmatrix} I_{EST} \\ Q_{EST} \end{bmatrix} \begin{bmatrix} h_{ii} & h_{iq} \\ h_{qi} & h_{qq} \end{bmatrix}^{-1} \quad (2)$$

Accordingly, in some embodiments, the correction controller 260 calculates I- and Q-phase correction signals $I_{CORR}$ and $Q_{CORR}$ to correct for I- and Q-phase errors $I_{SPUR}$ and $Q_{SPUR}$ by generating the 2×2 channel matrix $$\begin{bmatrix} h_{ii} & h_{iq} \\ h_{qi} & h_{qq} \end{bmatrix}$$

using the process 600; measuring the I- and Q-phase error estimates $I_{EST}$ and $Q_{EST}$ using the spur sense chain 300; and using equation 2 above to calculate the I- and Q-phase correction signals $I_{CORR}$ and $Q_{CORR}$ as a function of the I- and Q-phase error estimates $I_{EST}$ and $Q_{EST}$ and the 2×2 channel matrix $$\begin{bmatrix} h_{ii} & h_{iq} \\ h_{qi} & h_{qq} \end{bmatrix}.$$

Having calculated the I- and Q-phase correction signals $I_{CORR}$ and $Q_{CORR}$ as described above, the correction controller 260 of some embodiments performs a two-dimensional blind search (as described below with reference to FIG. 7) to adjust the I- and Q-phase correction signals $I_{CORR}$ and $Q_{CORR}$.

Figure 7:
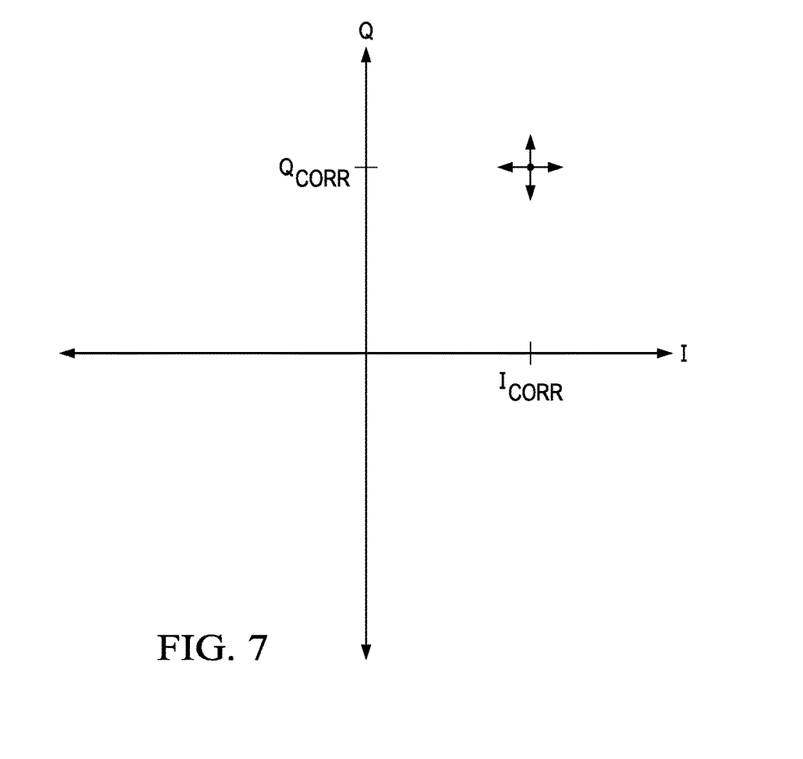
FIG. 7 is a graph illustrating a two-dimensional blind search according to an illustrative embodiment.

FIG. 7 is a graph illustrating a two-dimensional blind search according to an illustrative embodiment.

As shown in FIG. 7, the I- and Q-phase correction signals $I_{CORR}$ and $Q_{CORR}$ can be depicted graphically as a point in the I-Q coordinate system. In some embodiments, the correction controller 260 employs a blind search algorithm that repeatedly adjusts the I- and Q-phase correction signals $I_{CORR}$ and $Q_{CORR}$, measures the absolute spur level for each adjusted pair of I- and Q-phase correction signals $I_{CORR}$ and $Q_{CORR}$ using the spur sense chain 300 as described above, and identifies the adjusted I- and Q-phase correction signals $I_{CORR}$ and $Q_{CORR}$ that generates the minimum amount of absolute spur.

In the embodiment of FIG. 2, the DSA 180 of the transmit chain 100 has multiple attenuation settings that are adjusted to compensate for variations in the gain of the power amplifier 190. The I- and Q-phase errors $I_{SPUR}$ and $Q_{SPUR}$ and the I- and Q-phase correction signals $I_{CORR}$ and $Q_{CORR}$ are both attenuated by the DSA 180. If the attenuation setting of the DSA 180 changes (for example, during mission mode operation of the transmit chain 100), I- and Q-phase correction signals $I_{CORR}$ and $Q_{CORR}$ necessary to correct for the I- and Q-phase errors $I_{SPUR}$ and $Q_{SPUR}$ may vary. Accordingly, in some embodiments, the correction controller 260 calculates I- and Q-phase correction signals $I_{CORR}$ and $Q_{CORR}$ for each attenuation setting of the DSA 180 (for example, during power up configuration), monitors the attenuation setting of the DSA 180 (for example, during mission mode operation), and corrects for the I- and Q-phase errors $I_{SPUR}$ and $Q_{SPUR}$ by outputting the I- and Q-phase correction signals $I_{CORR}$ and $Q_{CORR}$ for the current attenuation setting of the DSA 180.

Figure 8:
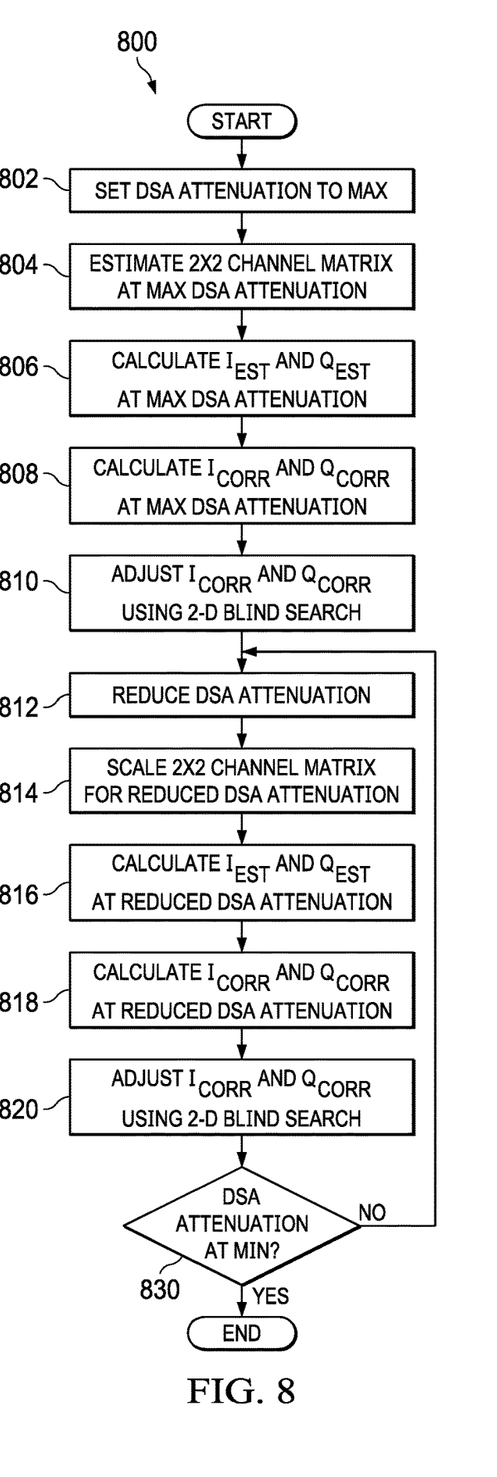
FIG. 8 is a flowchart illustrating a process for calculating I- and Q-phase correction signals for each attenuation setting of a digital step attenuator according to an illustrative embodiment.

FIG. 8 is a flowchart illustrating a process 800 for calculating the I- and Q-phase correction signals $I_{CORR}$ and $Q_{CORR}$ for each attenuation setting of the DSA 180 according to an illustrative embodiment.

In the embodiment of FIG. 8, the DSA 180 is initially set to the maximum attenuation setting in step 802 to minimize the power of the RF signals transmitted during the process 800. A 2×2 channel matrix for the maximum attenuation setting of the DSA 180 is calculated using the process 600 in step 804. The I- and Q-phase error estimates $I_{EST}$ and $Q_{EST}$ for the maximum attenuation setting of the DSA 180 are estimated using the spur sense chain 300 in step 806. In step 808, the I- and Q-phase correction signals $I_{CORR}$ and $Q_{CORR}$ are calculated for the maximum attenuation setting of the DSA 180 using equation 2 above, the 2×2 channel matrix generated in step 804, and the I- and Q-phase error estimates $I_{EST}$ and $Q_{EST}$ estimated in step 806. In some embodiments, a two-dimensional blind search is performed to adjust the I- and Q-phase correction signals $I_{CORR}$ and $Q_{CORR}$ in step 810.

The attenuation setting of the DSA 180 is reduced in step 812. In some embodiments, separate 2×2 channel matrixes are each calculated using the process 600 for each attenuation setting of the DSA 180. In other embodiments, the same 2×2 channel matrix is used for each attenuation setting of the DSA 180. In yet other embodiments, the 2×2 channel matrix calculated for the previous attenuation setting of the DSA 180 is scaled in step 814 by a predetermined amount that has been estimated to account for the reduced attenuation. The I- and Q-phase error estimates $I_{EST}$ and $Q_{EST}$ for the reduced attenuation setting of the DSA 180 are estimated using the spur sense chain 300 in step 816. In step 818, the I- and Q-phase correction signals $I_{CORR}$ and $Q_{CORR}$ are calculated for the reduced attenuation setting of the DSA 180 using equation 2 above, the 2×2 channel matrix generated in step 814, and the I- and Q-phase error estimates $I_{EST}$ and $Q_{EST}$ estimated in step 816. In some embodiments, a two-dimensional blind search is performed to adjust the I- and Q-phase correction signals $I_{CORR}$ and $Q_{CORR}$ in step 820.

Steps 812 through 820 are repeatedly performed, using each attenuation setting of the DSA 180, to calculate I- and Q-phase correction signals $I_{CORR}$ and $Q_{CORR}$ for each attenuation setting of the DSA 180, until the I- and Q-phase correction signals $I_{CORR}$ and $Q_{CORR}$ are calculated for the minimum attenuation setting (Step 830: Yes).

The process 800 enables the correction controller 260 to calculate the I- and Q-phase correction signals $I_{CORR}$ and $Q_{CORR}$ for each attenuation setting of the DSA 180 (e.g., during power-up configuration of the transmit chain 100). Accordingly, in some embodiments, the correction controller 260 monitors the attenuation setting of the DSA 180 (e.g., during mission mode operation) and corrects for the I- and Q-phase errors $I_{SPUR}$ and $Q_{SPUR}$ by outputting the I- and Q-phase correction signals $I_{CORR}$ and $Q_{CORR}$ for the current attenuation setting of the DSA 180.

In the embodiments described above, the spur estimation and correction system 200 compensates for the $F_{DAC}/2$ spur generated by a dual band transmit chain 100 in an interleaving-by-2 configuration. In other embodiments, the spur estimation and correction system 200 is configured to compensate for the $F_{DAC}/2$ spur generated by a transmit chain having any number of bands.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A method for reducing spurious emissions output by a transmit chain having an interleaving multiplexer, the method comprising:
   measuring an estimated I-phase error;
   generating and adding an I-phase correction signal to compensate for the estimated I-phase error;
   measuring an estimated Q-phase error; and
   selectively connecting one or more capacitors within the interleaving multiplexer to compensate for the estimated Q-phase error.

2. The method of claim 1, wherein:
   the transmit chain includes a plurality of frequency bands; and
   each frequency band of the transmit chain includes a digital to analog converter (DAC) and a transistor within the interleaving multiplexer coupling the DAC to an output path in response to a clock signal.

3. The method of claim 2, wherein the I-phase error is in phase with the clock signal and the Q-phase error is a derivative of the clock signal.

4. The method of claim 2, wherein the one or more capacitors are selectively connected between the clock signal and the output path to compensate for the Q-phase error.

5. The method of claim 2, wherein:
   each frequency band includes a capacitor-switch array, each capacitor-switch array comprising a plurality of capacitors and switches, each capacitor connected in series with one of the switches between the clock signal and the output of the interleaving multiplexer; and
   the one or more capacitors are selectively connected by closing one or more of the switches.

6. The method of claim 1, wherein measuring the estimated I-phase error comprises:
   mixing a signal output by the interleaving multiplexer with an I-phase clock signal to down-convert the signal output by the interleaving multiplexer;
   low-pass filtering the down-converted signal output by the interleaving multiplexer; and
   converting the low-pass filtered and down-converted signal to digital.

7. The method of claim 1, wherein measuring the estimated Q-phase error comprises:
   mixing a signal output by the interleaving multiplexer with a Q-phase clock signal to down-convert the signal output by the interleaving multiplexer;
   low-pass filtering the down-converted signal output by the interleaving multiplexer; and
   converting the low-pass filtered and down-converted signal to digital.

8. The method of claim 1, further comprising:
   injecting a known I-phase correction signal into transmit chain;
   measuring a change in estimated I-phase error;
   calculating a channel coefficient h indicative of the change in estimated I-phase error relative to the known I-phase correction signal;
   measuring a change in estimated Q-phase error;
   calculating a channel coefficient $h_{iq}$ indicative of the change in estimated Q-phase error relative to the known I-phase correction signal;
   injecting a known Q-phase correction signal by selectively connecting one or more of the capacitors within the interleaving multiplexer;
   measuring a change in estimated I-phase error;
   calculating a channel coefficient $h_{qi}$ indicative of the change in estimated I-phase error relative to the known Q-phase correction signal;
   measuring a change in estimated Q-phase error; and
   calculating a channel coefficient $h_{qq}$ indicative of the change in estimated Q-phase error relative to the known Q-phase correction signal.

9. The method of claim 8, further comprising:
   calculating an I-phase correction signal $I_{CORR}$ and a Q-phase correction signal $Q_{CORR}$ based on the estimated I-phase error $I_{EST}$ and the estimated Q-phase error $Q_{EST}$ according to $$\begin{bmatrix} I_{CORR} \\ Q_{CORR} \end{bmatrix} = - \begin{bmatrix} I_{EST} \\ Q_{EST} \end{bmatrix} \begin{bmatrix} h_{ii} & h_{iq} \\ h_{qi} & h_{qq} \end{bmatrix}^{-1}.$$

10. The method of claim 1, wherein the transmit chain includes a digital step attenuator (DSA) having a plurality of attenuation settings, the method further comprising:
   identifying an I-phase correction signal and a Q-phase correction signal for each of the plurality of attenuation settings;
   storing an I-phase correction signal and a Q-phase correction signal for each of the plurality of attenuation settings;
   identifying the attenuation setting of the DSA;
   injecting the I-phase correction signal for the attenuation setting of the DSA; and
   injecting the Q-phase correction signal for the attenuation setting of the DSA by selectively connecting one or more capacitors within the interleaving multiplexer to compensate for the estimated Q-phase error.

11. A transmitter comprising:
   an interleaving multiplexer operable to combine signals in two or more frequency bands, having an output;
   a spur sense chain, coupled to the output of the interleaving multiplexer;
   a correction controller coupled to the spur sense chain; and
   a Q path corrector coupled to the correction controller.

12. The transmitter of claim 11, wherein each frequency band of the transmitter includes a digital-to-analog converter (DAC) and a transistor within the interleaving multiplexer coupling the DAC to the output of the interleaving multiplexer in response to a clock signal.

13. The transmitter of claim 12, wherein an I-phase error is in phase with the clock signal and a Q-phase error is a derivative of the clock signal.

14. The transmitter of claim 12, wherein one or more capacitors are selectively connected between the clock signal and the output of the interleaving multiplexer to compensate for a Q-phase error.

15. The transmitter of claim 12, wherein:
   the Q path corrector comprises a capacitor-switch array for each frequency band, each capacitor-switch comprising a plurality of capacitors and switches, each capacitor connected in series with one of the switches between the clock signal and the output of the interleaving multiplexer; and
   the one or more capacitors are selectively connected by closing one or more of the switches.

16. The transmitter of claim 11, wherein the spur sense chain comprises:
   a multiplexer operable to selectively output an I-phase clock signal or a Q-phase clock signal;
   a mixer operable to mix combined signal output by the interleaving multiplexer with the I-phase clock signal or the Q-phase clock signal to down-convert the combined signal;
   a low-pass filter operable to filter the down-converted combined signal; and
   an analog-to-digital converter operable to convert the low-pass filtered and down-converted combined signal to digital.

17. The transmitter of claim 11, wherein:
   the correction controller is operable to inject a known I-phase correction signal into a digital transmit chain;
   the spur sense chain is operable to measure a change in estimated I-phase error;
   the correction controller is operable to calculate a channel coefficient $h_{ii}$ indicative of the change in estimated I-phase error relative to the known I-phase correction signal;
   the spur sense chain is operable to measure a change in estimated Q-phase error;
   the correction controller is operable to calculate a channel coefficient $h_{iq}$ indicative of the change in estimated Q-phase error relative to the known I-phase correction signal;
   the Q path corrector is operable to inject a known Q-phase correction signal by selectively connecting one or more of the capacitors within the interleaving multiplexer;
   the spur sense chain is operable to measure a change in estimated I-phase error;
   the correction controller is operable to calculate a channel coefficient $h_{qi}$ indicative of the change in estimated I-phase error relative to the known Q-phase correction signal;

the spur sense chain is operable to measure a change in estimated Q-phase error; and the correction controller is operable to calculate a channel coefficient $h_{qq}$ indicative of the change in estimated Q-phase error relative to the known Q-phase correction signal.

18. The transmitter of claim 17, wherein the correction controller is operable to calculate an I-phase correction signal $I_{CORR}$ and a Q-phase correction signal $Q_{CORR}$ based on the estimated I-phase error $I_{EST}$ and the estimated Q-phase error QEs according to $$\begin{bmatrix} I_{CORR} \\ Q_{CORR} \end{bmatrix} = -\begin{bmatrix} I_{EST} \\ Q_{EST} \end{bmatrix}\begin{bmatrix} h_{ii} & h_{iq} \\ h_{qi} & h_{qq} \end{bmatrix}^{-1}.$$

19. The transmitter of claim 11, further comprising a digital step attenuator (DSA) having a plurality of attenuation settings, wherein the correction controller is operable to:
  identify an I-phase correction signal and a Q-phase correction signal for each of the plurality of attenuation settings;
  identify the attenuation setting of the DSA;
  inject the I-phase correction signal for the attenuation setting of the DSA; and
  cause the Q path corrector to inject the Q-phase correction signal for the attenuation setting of the DSA by selectively connecting one or more capacitors within the interleaving multiplexer to compensate for the estimated Q-phase error.

20. A transmit chain, comprising:
  a first digital-to-analog converter (DAC) having an input and an output;
  a second DAC having an input and an output;
  an interleaving multiplexer, coupled to the first DAC output and the second DAC output;
  a Q path corrector comprising:
    a first capacitor-switch array comprising a first terminal, a second terminal and a first plurality of capacitors and switches, each capacitor connected in series with one switch between the first and second terminals, the first terminal coupled to a first clock signal and the second terminal coupled to a transmit output; and
    a second capacitor-switch array comprising a third terminal, a fourth terminal and a second plurality of capacitors and switches, each capacitor connected in series with one switch between the third and fourth terminals, the third terminal coupled to the second clock signal and the fourth terminal coupled to transmit output;
  a spur sense chain, coupled to the transmit output; and
  a correction controller, coupled to the interleaving multiplexer and the spur sense chain.

* * * * *